(12) United States Patent
Wiell et al.

(10) Patent No.: US 11,002,694 B2
(45) Date of Patent: May 11, 2021

(54) HARD X-RAY PHOTOELECTRON SPECTROSCOPY ARRANGEMENT AND SYSTEM

(71) Applicant: Scienta Omicron AB, Uppsala (SE)

(72) Inventors: Tomas Wiell, Uppsala (SE); Cristopher Liljenberg, Uppsala (SE); Pål Palmgren, Järfälla (SE)

(73) Assignee: Scienta Omicron AB

( * ) Notice: Subject to any disclaimer, the term of this patent is extended or adjusted under 35 U.S.C. 154(b) by 0 days.

(21) Appl. No.: 16/588,374

(22) Filed: Sep. 30, 2019

(65) Prior Publication Data

US 2020/0103358 A1 Apr. 2, 2020

(30) Foreign Application Priority Data

Oct. 1, 2018 (SE) .................................... 1851182-4
Oct. 2, 2018 (SE) .................................... 1851185-7

(51) Int. Cl.
*G01N 23/00* (2006.01)
*G01N 23/2273* (2018.01)
(Continued)

(52) U.S. Cl.
CPC .......... *G01N 23/2273* (2013.01); *H01J 37/21* (2013.01); *H01J 37/256* (2013.01); *H01J 2237/2522* (2013.01)

(58) Field of Classification Search
CPC ......... G01N 23/2273; G01N 2223/085; G01N 2223/1016; H01J 37/21; H01J 37/256; H01J 2237/2522; H05G 1/02; H05G 1/54

(Continued)

(56) References Cited

U.S. PATENT DOCUMENTS

| 2006/0169893 A1* | 8/2006 | Lee ..................... G01N 23/2273 250/305 |
| 2007/0069125 A1* | 3/2007 | Schueler ............ G01N 23/2273 250/305 |
| 2016/0327499 A1* | 11/2016 | Kobayashi ......... G01N 23/2273 |

FOREIGN PATENT DOCUMENTS

| GB | 2538125 A | 11/2016 |
| JP | 2001-013292 A | 1/2001 |

(Continued)

OTHER PUBLICATIONS

Kobata et al., "Development of the Hard-X-ray Angle Resolved X-ray Photoemission Spectrometer for Laboratory Use", Analytical Sciences, The Japan Society for Analytical Chemistry, vol. 26, Feb. 2010, pp. 227-232.

(Continued)

*Primary Examiner* — Michael Maskell
(74) *Attorney, Agent, or Firm* — Morrison & Foerster LLP

(57) ABSTRACT

The present invention relates to a hard X-ray photoelectron spectroscopy (HAXPES) system comprising an X-ray source providing a beam of photons which is directed through the system so as to excite electrons from an illuminated sample. An X-ray tube is connected to a monochromator vacuum chamber in which a crystal is configured to monochromatize and focus the beam onto an illuminated sample. A hemispherical electron energy analyser is mounted onto the analysis chamber. An air gap is provided between the X-ray tube and the monochromator chamber, which air gap is provided with a first radiation trap to shield the ambient air from the radiation when the air gap is illuminated with X-rays from the source.

20 Claims, 5 Drawing Sheets

(51) Int. Cl.
*H01J 37/21* (2006.01)
*H01J 37/256* (2006.01)

(58) Field of Classification Search
USPC .................................... 250/305, 306, 307
See application file for complete search history.

(56) References Cited

FOREIGN PATENT DOCUMENTS

| | | |
|---|---|---|
| JP | 2016-212076 A | 6/2015 |
| WO | 2012054471 A1 | 4/2012 |

OTHER PUBLICATIONS

Extended European Search Report received for European Patent Application No. 19200530.4, dated Feb. 27, 2020, 10 pages.
Oxford Instruments, "Oxford Instruments X-Ray Technology, Power Supplies, Integrated Sources and X-ray Tubes", Retrieved from the Internet: http://www.nikiglass.co.jp/supplier/x-ray/Oxford/new/XRay_Technology_Catalog.pdf, Apr. 2016, pp. 1-58.
Regoutz et al., "A Novel Laboratory-Based Hard X-Ray Photoelectron Spectroscopy System", Review of Scientific Instruments, vol. 89, 2018, pp. 073105-1-073105-10.

\* cited by examiner

HARD X-RAY PHOTOELECTRON SPECTROSCOPY ARRANGEMENT AND SYSTEM

CROSS REFERENCE TO RELATED APPLICATIONS

This application claims priority to SE 1851182-4, filed Oct. 1, 2018, and SE 1851185-7, filed Oct. 2, 2018, both of which are hereby incorporated by reference.

TECHNICAL FIELD

The present invention relates to an arrangement in a hard X-ray photoelectron spectroscopy (HAXPES) system with a monochromated, micro-focused X-ray source that is configured to provide photons. HAXPES, which is the established acronym for this experimental technique, uses X-rays with photon energies above 2 keV to excite photo-electrons. The excited photo-electrons are analysed to study for example properties relating to their chemical environment and electronic structure of materials.

BACKGROUND ART

To date, the majority of HAXPES experiments for different scientific and industrial purposes have been conducted on the approximately only 20 existing beamlines situated at synchrotrons worldwide. These few synchrotrons around the world are very large-scale facilities and belong to national laboratories. The small number of available beamlines and related instrumentation, the significant costs for operating them and associated access limitations, have restricted the amount of output and development efforts of the HAXPES technique. The main reason for HAXPES being confined to synchrotrons is the dramatic decrease in photo-ionisation cross sections with an increase in X-ray energy. In order to counteract said decrease in photo-ionisation, highest possible X-ray intensities combined with highly efficient photoelectron analysers with, in relative terms, very large acceptance angles are necessary.

Even though HAXPES is also afflicted with certain limitations, just as all other experimental techniques, there is a strong motivation to pursue this technique, including the ability to study bulk materials, buried layers and interfaces, and samples without any need of surface preparation. These measurements are enabled by the increase in information-depth with increasing photon energy.

The previously mentioned lack of wide ranging access to HAXPES facilities combined with a large number of potential applications is a strong motivation to develop the laboratory-based HAXPES system here described. Up to now, the development of laboratory systems has been impeded particularly by the limited availability of high intensity, monochromated X-ray sources and large angle, high-energy analysers. Therefore, only a very small number of systems have been developed so far, and then with a significantly lower maximum photon energy of 5.4 keV (Cr Kα).

In addition to the much higher photon energy, the laboratory-based HAXPES system according to the present invention comprises three separate vacuum chambers: 1) a monochromator chamber housing a monochromating crystal, 2) an X-ray tube housing an electron gun and a jet of liquid Gallium, and 3) an analysis chamber housing the photo-electron energy analyser and a fast-entry load lock in which the sample to be analysed is introduced into the vacuum system.

Since the demands of the vacuum systems in the three separate vacuum chambers is different, in theory it would be preferable to separate them. However, such a separation of the vacuum chambers inevitably leads to an increased risk of X-rays radiation leaks, which could be of a harmful nature if not duly controlled. Furthermore, the separation of the vacuum systems must still allow for a motion of the constituting parts relative to each other, as the high photon energy puts severe demands on the precision of the parts position in order to fulfil the diffraction condition required by the monochromator crystal. This requirement of motion of the constituting parts relative to each other even further accentuates the risk for radiation leakage, which as mentioned may be potentially harmful at certain levels.

The varying demands of the vacuum systems are mainly caused by the cleanliness offered by the different vacuum levels. In the sample environment, an ultra-high vacuum level is required to keep the sample clean, whereas in the monochromator chamber it is sufficient to maintain a high-vacuum level to avoid absorption of the X-rays by the residual gas. In the X-ray tube, a high vacuum level is also necessary for safe operation of the electron gun, which generates electrons that hits the liquid Ga, thereby generating X-rays. The separation of the X-ray tube is also needed to avoid Ga contamination in the other vacuum systems. It is also of importance to be able to optimize the X-ray tube position relative to the monochromator crystal as well as to be able to move the monochromator in unison with the X-ray tube relative to the analysis chamber and electron analyser.

As mentioned initially, prior to the laboratory-based HAXPES system here described, synchrotron light sources have been in use to create X-rays for photo-electron spectroscopy experiments at the same high excitation energies. Such experiments are normally placed in a separate room, not accessible during experiments due to the harmful radiation levels. Experiment control is therefore normally made remotely. Other types of equipment in which these high excitation energies typically are used are in X-ray diffractometers. This types of experiments are normally enclosed in a cabinet, housing all instrumentation and by its size and thickness forming the actual radiation protection.

For a compact, laboratory-based system, bulky and expensive arrangements for protection from radiation leakage and, therefore, complex operation of the HAXPES system, is not viable. All movements would have to be motorized and several cameras would have to be installed to be able to control and optimize the system without hands-on access. There are a number of restrictions on the permitted motion and if the movement of the parts were to be motorized, a quite complex system of motors and limit switches would result; thereby making it unpractical to use and most likely prohibitively expensive given the up to 12 degrees of freedom provided in the HAXPES system. Due to the combination of high excitation energies and the required high level of precision in the X-ray optics, a direct hand-to-eye correlation is considered necessary in order to set the optics correctly and achieve the correct energy resolution at maximum radiation flux.

Thus, there is a need to address the difficulties in HAXPES system design associated with relative movements of vacuum chambers, simplicity in operation, precision in setting the optical equipment, accessibility and space requirements. Last by most importantly, the system needs to be in full compliance with applicable safety regulations to avoid radiation leakage, since hard X-ray photoelectron spectroscopy utilizes X-rays of high photon energies to excite photo-electrons from the sample under investigation.

The present application utilises an electron gun that excites the Gallium is running at 70 kV, which also creates dangerous radiation that easily penetrates most materials. Prior art systems for HAXPES have been running at significantly lower energies and thus, radiation has not been any major issue. At excitation energies up to 30 kV, which is used for Cr Kα-based systems, only a few millimetres of steel will block the radiation. However, to block radiation created by 70 kV electrons, rather centimetres than millimetres of steel thickness is needed.

SUMMARY OF THE INVENTION

It is an object of the present invention to alleviate at least some of the mentioned problems and impediments associated with currently existing experimental techniques and related equipment.

This object is achieved by means of a hard X-ray photo-electron spectroscopy (HAXPES) system, in particular a laboratory-based system, comprising:

an X-ray tube providing a beam of photons, which via an X-ray monochromator is directed through the system so as to excite electrons from an illuminated sample, the X-ray tube being connected to a monochromator vacuum chamber in which a crystal is configured to monochromatize and focus the beam onto the sample, the monochromator vacuum chamber is connected to an analysis vacuum chamber via a flexible vacuum bellow, which is fixed to both vacuum chambers, the flexibility of the bellow allowing precise alignment of the monochromatized and focused beam, the illuminated sample being mounted on a manipulator, movable in at least one direction to allow for measurements at different sample angles, inside the analysis vacuum chamber, the analysis vacuum chamber being connected to an electron energy analyser, which is mounted onto the analysis vacuum chamber, characterised in that a gap is provided between the X-ray source and the monochromator vacuum chamber, which gap is provided with a first radiation trap to shield the ambient from the radiation when the gap is illuminated with X-rays from the X-ray tube.

The design of the first radiation trap assembly efficiently prevents X-ray radiation leakage while allowing for a maximum flexibility in relative movements between the X-ray tube and the monochromator vacuum chamber. One of the main purposes of the first motion, which is allowed by the design of the first radiation trap assembly, is to optimize the performance of the monochromator in terms of flux and resolving power.

In accordance with a second embodiment, a flexible vacuum bellow, which is designed to allow for precise alignment of the monochromated and focused beam, is provided with a second radiation trap assembly to shield the ambient from the radiation, when the flexible vacuum bellow itself is illuminated with X-rays from the X-ray tube. More in detail, the second motion, which is allowed by the design of the second radiation trap assembly, primarily serves to optimize the position of the monochromated X-rays with respect to the electron energy analyser. The demands on motion of the parts relative to each other, implies that the X-rays are allowed to traverse the air gap between two separated parts of the system, or are allowed to traverse through the flexible bellow in which there is a vacuum.

Both of the above mentioned embodiments may be combined, i.e. by employing both the first and the second radiation trap assemblies in one system. However, as an alternative, the system may be designed to utilise either of the first and the second radiation trap assemblies.

Due to the high excitation voltage of the X-ray tube and the thereto related penetrative power of the radiation, the separation of the vacuum chambers poses a severe problem. This is due to that any material hit by the primary or secondary radiation fields will serve as sources of radiation themselves, as will the air itself, when energetic X-rays traverses through this medium. As mentioned, the dose rate of radiation that a person would be subjected to, could easily surpass the safe levels set by radiation authorities, i.e. potentially be of harm to humans. The present invention is advantageous also in providing an effective protection, by which consequential and harmful X-ray radiation leaks can be duly controlled and avoided, while at the same time facilitate excellent conditions for precise and reliable measurements and experiments.

In more detail, the present invention provides compact radiation traps that shield the ambient from the radiation generated when the air gap and/or vacuum bellow, or the material surrounding them, is illuminated with high energy X-rays from the X-ray tube. At the same time, the radiation traps allow for the desired relative movements of the connected components. In order to reduce the primary field to less than harmful levels, the radiation traps are designed so that parts illuminated by the ternary radiation field are outside line of sight of an observer looking into the radiation trap.

The laboratory-based HAXPES system according to the invention is provided with a monochromated, micro-focused Ga Kα X-ray source giving a photon energy of 9.25 keV. The energy level of this X-ray source differentiates it from all other comparable systems, known in the technical field. Moreover, the invention also relates to an improved design and new fields of applicability of a laboratory-based HAXPES system that utilizes a high energy, monochromated Ga X-ray source with an excitation energy of 9.25 keV. The combination of a powerful X-ray tube with an efficient and stable monochromator and an electron energy analyser with a wide acceptance angle results in excellent performance. Basic characteristics of the spectrometer here described is the ability to provide measurement results with a minimum energy resolution of 465 meV. Data obtained from samples of scientific relevance, including measurement of bulk and hetero-structure samples displays that high-quality data can be collected, both in terms of energy resolution and intensity. The HAXPES system according to the invention further delivers data collected with a hard X-ray energy source previously only accessible at synchrotrons. Results from this system are able to produce independent, complete datasets as well as supporting other experiments e.g., energy-dependent synchrotron work through preliminary experiments in the laboratory. In practice, this means that the improved system will be versatile and both vertically and horizontally applicable, and of significant importance in several scientific fields of present and future relevance.

DETAILED DESCRIPTION

Figure 1:
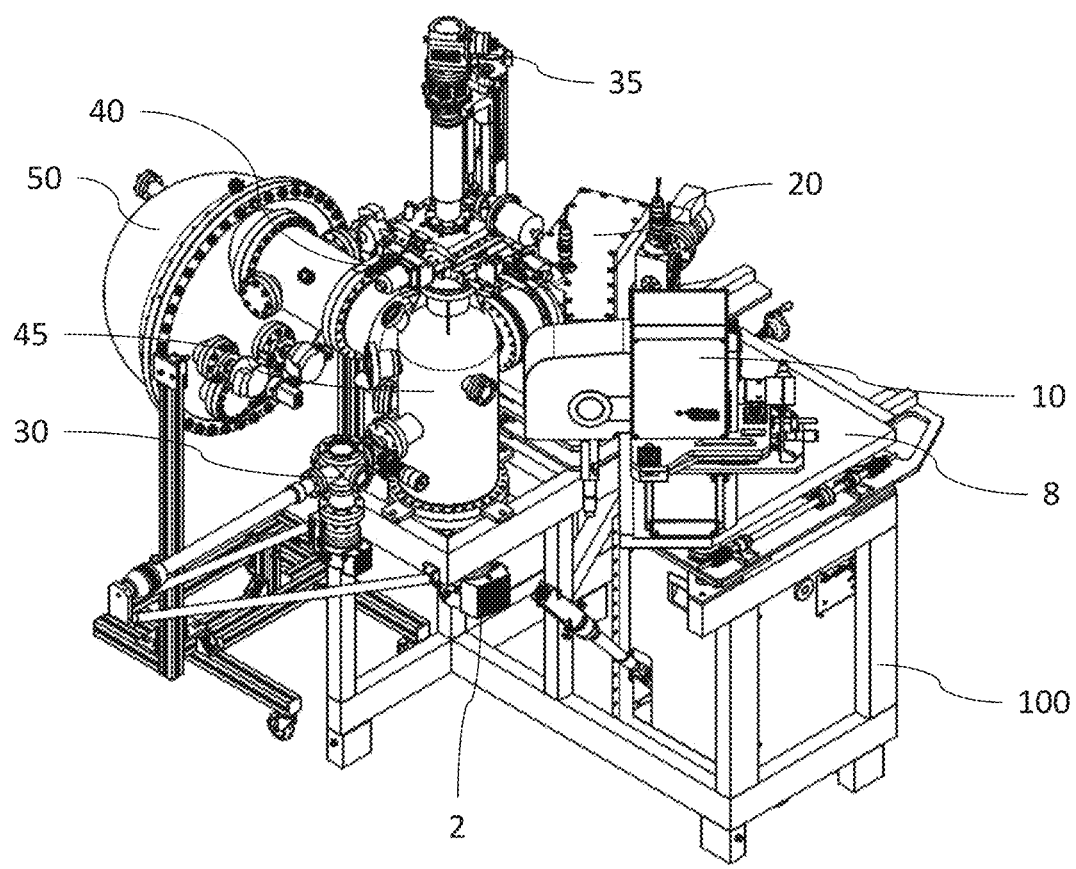
FIG. 1 is a front side overview of a laboratory-based HAXPES system.
Figure 2:
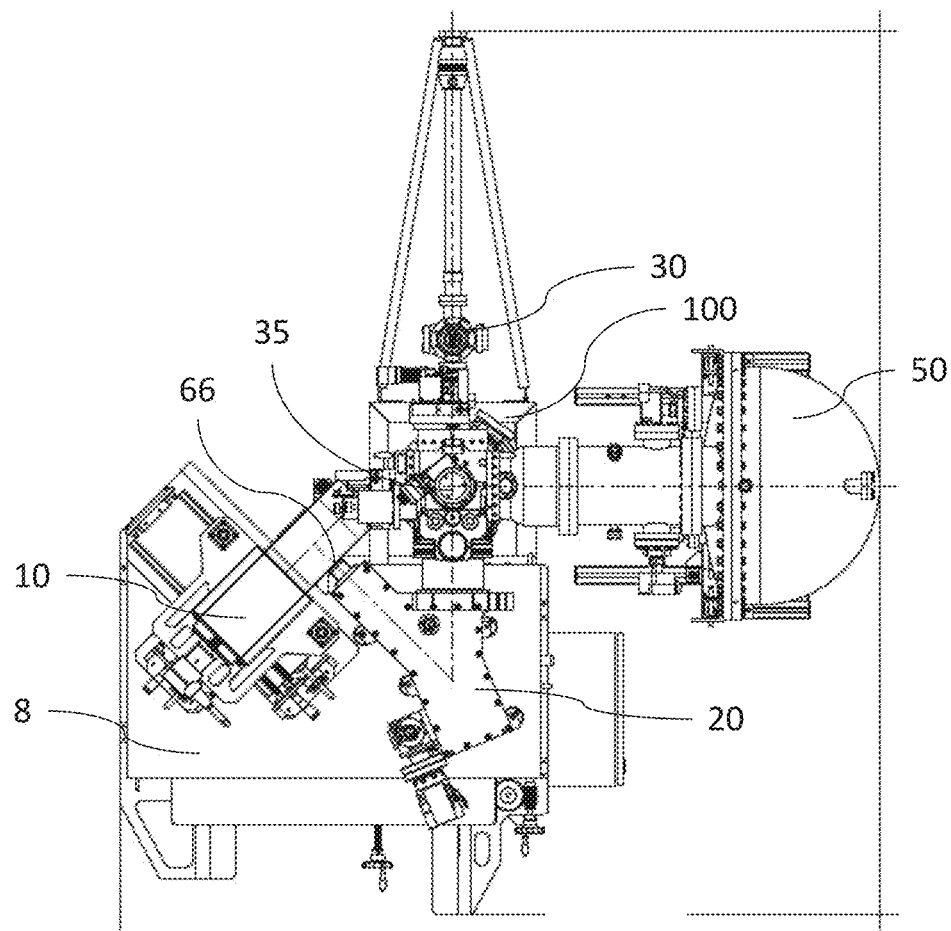
FIG. 2 depicts the system of FIG. 1, although this overview perspective is from the top, from which the air gap between the X-ray tube and the monochromator chamber can be seen.

FIGS. 1 and 2 respectively show a front and a top side overview of a laboratory-based HAXPES system prototype, the system places on a base 100. Some features are best seen from the front perspective, and some are best seen from the top perspective. The features shown include a pumping system 2, which is connected to a control system, a radiation safety system and tables 8 for adjustments in three dimensions of an X-ray source 10. The X-ray source illuminates an X-ray monochromator 20 from which the monochromated X-ray beam is directed onto a sample, which was introduced into the vacuum system via the load lock 30. A manipulator 35 is provided with XYZ and ±180° rotation, and preferably also heating capability, and a camera system 40 is provided for precise orientation and sample navigation.

The above mentioned parts are connected to the analysis vacuum chamber 45, in which the sample is located during analysis. An electron analyser is provided, preferably of the hemispherical electron energy analyser type. To match the energy resolution of the X-ray source and to collect as much of the photo-electron signal as possible, a hemispherical electron analyser with a very large acceptance angle would be the preferred solution. However, other types of analysers, such as sector hemispheres, cylindrical mirror analysers and retarding field analysers, cannot be excluded even if the energy resolution would most likely be insufficient for those purposes.

With particular reference to FIG. 2, the system as in FIG. 1 is shown, but drawn from the top view, from which view the position of an air gap between the X-ray tube and the monochromator chamber can be seen.

The laboratory-based HAXPES system according to the present invention consists of three separate vacuum chambers: an X-ray tube, a monochromator chamber, and an analysis chamber, some of which have been briefly discussed above. A hemispherical electron energy analyser is attached to an analysis chamber, preferably with its entrance slit oriented in the horizontal plane. The X-ray tube is connected to the monochromator chamber, which in turn connects to the analysis chamber. Essential system parameters are controlled through a programmable logic controller (PLC) user interface allowing regulation of at least one of the vacuum system, safety interlocks, bake-out settings, and monochromator crystal temperature.

A more detailed overview of the design of the vacuum system and the load lock shows that the vacuum system comprises three separate turbo pumps situated on the load lock, analysis chamber and monochromator chamber. The load lock and monochromator chamber could have 80 L s$^{-1}$ turbo pumps (Pfeiffer HiPace 80), and the analyser chamber has a 300 L s$^{-1}$ turbo pump (Pfeiffer HiPace 300). The turbo pumps may all share one 6.2 m$^3$ h$^{-1}$ oil-free backing pump (Edwards nXDS6i) and could be separated by automatic valves. This efficient configuration is made possible through the PLC control of the entire vacuum system, including pumps, valves, and gauges. In addition, the analysis chamber may house a titanium sublimation pump (VACGEN ST22).

The load lock has a standard transfer pressure of $<1\times10^{-7}$ mbar, which by means of the above exemplified vacuum system configuration will be routinely reached within 30 min. The load lock is fitted with a linear, magnetic coupled transfer arm used to transfer samples from the load lock into the analysis vacuum chamber. It also has a multi-sample storage holder that can carry up to five samples mounted on Omicron flag-style sample plates, which are well-known to scientists in the field.

The analysis vacuum chamber is made from mu-metal and has a base pressure of $<5\times10^{-10}$ mbar. Samples may be transferred from the load lock onto a 4-axis manipulator (VACGEN Omniax 200) of the analysis chamber. The rotational movement of the manipulator allows measurements at different sample angles, including grazing incidence geometry. A hemispherical electron energy analyser (Scienta Omicron EW4000) is mounted horizontally onto the analysis chamber, with the entrance slit being horizontally aligned.

The monochromator chamber is connected to the analysis chamber via a flexible bellow 94 allowing precise alignment of the monochromated X-rays. A Kapton window 68, 96 separates the vacuum volumes of the monochromator from the analysis chamber. The analysis chamber is fitted with extra ports for further equipment, including but not limited to charge neutralisers, sputter guns (e.g., gas cluster ion beam sources), and additional X-ray tubes (e.g., monochromated Al Kα).

Conceivably, the X-ray tube for providing the X-ray radiation is an Excillum MetalJet-D2+70 kV, which is based on a Ga metal-jet anode. Ga is recirculated in a closed metal-jet loop and hit by an electron beam with an 80×20 µm$^2$ spot size and an intensity of 250 W, which is generated by an electron gun (70 kV). X-rays are then monochromated and focused onto the sample by a bent Si crystal with a Rowland circle within the range of 300-700 mm, preferably 550 mm. The crystal is kept at a constant, elevated temperature to give optimum performance, including high spectral resolution and intensity, as well as long-term stability.

The entire setup is mounted and could be pre-aligned on an optical table, which advantageously is fully adjustable in x, y, and z. This freedom of movement is necessary to precisely align the X-ray spot with respect to the field of view of the analyser.

The mentioned Scienta Omicron EW4000 hemispherical electron energy analyser used in this experimental setup has a maximum measurable kinetic energy of 12 keV. It has a large acceptance angle of 60°, giving high measurement intensities. The hemisphere has a radius of 200 mm and a working distance of 40 mm. Pass energies are available across a wide range from 2 to 1000 eV, with energies of 10-500 eV used routinely. The entrance slit of the hemisphere is horizontal with respect to the X-ray footprint on the sample, giving maximum intensity. The analyser may further be equipped with nine straight entrance slits varying in dimensions from 0.1 to 4 mm. The 2D-detector setup consists of a multi-channel plate (MCP), phosphor screen, and CCD camera. The detector simultaneously covers 9.1% of the pass energy.

All of the above described components, settings and experimental configurations are conceivable for use, and even though they have been proven to work in practice, they are given merely as examples. It is to be understood that none of them needs to be fixed, and components and settings could be possibly be adjusted or replaced without adversely affecting the inventive system or its functionality.

The system performance with respect to energy resolution, X-ray spot size vs. intensity, X-ray power vs. intensity and stability has been shown to be more than satisfying. For a more in-depth discussion on system performance and an outline of scientific applications, further reference is made to Regoutz et al., *Review of Scientific Instruments*, 89, 073105 (2018).

Figure 3:
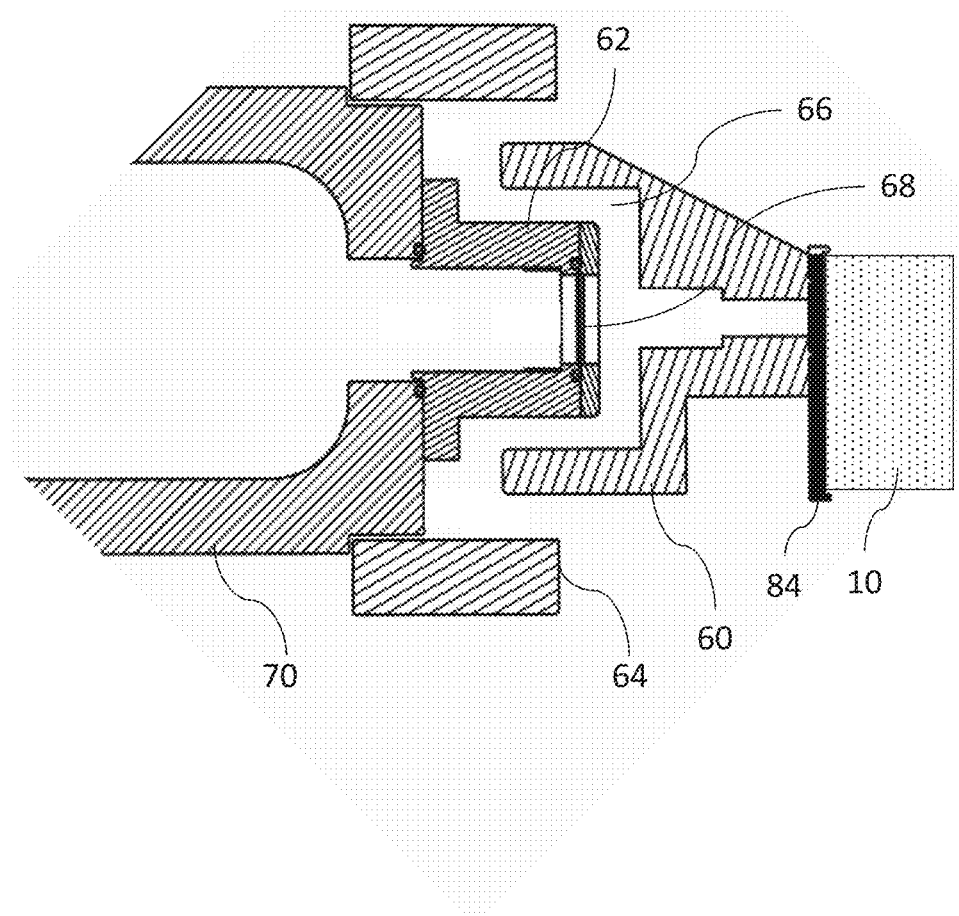
FIG. 3 is a cross-sectional view of a horizontal cut through a radiation trap assembly in which the first, second and third radiation trap parts, as well as the air gap are visible.

FIG. 3 is a cross-sectional view of a horizontal cut through a radiation trap assembly in which the first, second and third radiation trap wall parts 60, 62, 64, as well as the air gap 66 are visible. It relates to the first embodiment of the radiation trap assembly according to the present invention, the embodiment which features the air gap.

In total three parts form the radiation trap. Onto the X-ray tube 10 is the first radiation wall part 60, located on the exit side of the X-ray tube, of the radiation trap mounted via several screws to a tungsten alloy part 84 of the vacuum vessel wall. The material in the first radiation wall part is brass (SS5170) of sufficient thickness to block the most energetic radiation emitted from the X-ray tube. A second radiation wall part 62 is made of Cu (SS5011) and a third radiation wall part 64, as well as the monochromator body 70, is made from stainless steel (AISI 304), and also here is the material thicknesses enough to block the most energetic radiation. Both the second and third radiation wall parts, both of which are located on the entrance side of the monochromator, are firmly affixed to the monochromator body using screws. The third radiation wall part is monitored to be in place by an interlock system, using micro switches, that turns the X-ray tube off if this third part is removed. The second part is part of the vacuum system, in turn also part of the interlock system and if the monochromator is vented, the X-rays are turned off.

The radiation trap is assembled when the first radiation wall part 60 is docked into the second 62 and third 64 radiation wall parts of the trap, thus making up a labyrinth from which radiation generated by hitting gas molecules in the air gap, the Kapton window 68 or the surrounding material of the trap itself (i.e. the secondary or higher order radiation fields), cannot escape.

The maximum movement the trap allows for is approximately 10 mm, independently in three dimensions, but could easily be extended to more than that depending on the needs. In designing the trap, the extreme positions of the parts in it has been taken into account, thus enabling safe operation of the X-ray source. The trap itself does not allow for motions perpendicular to the beam direction larger than the maximum permissible, but still keep the observer out of line of sight, because the constituting parts will collide. To ensure that the trap is not pulled apart (in the direction along the beam path), there is a pull wire attached to the X-ray tube, linking it to the monochromator body. If the X-ray tube is pulled too far from the monochromator tank, the pull wire will be released, and via the interlock system shut the tube off.

Figure 4:
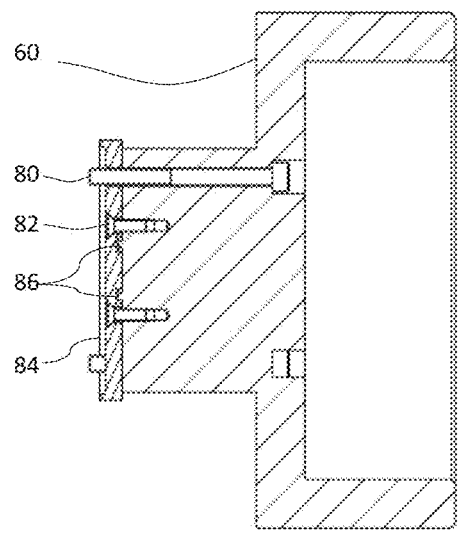
FIG. 4 is a cross-sectional view of the radiation trap assembly in a radial perspective, in which added grooves are shown, grooves intended to prevent radiation leaks when two flat surfaces meet.

FIG. 4 is a cross-sectional view of the radiation trap from another angle, in which the added grooves 86 are shown between the screws 80, 82, these grooves are intended to prevent radiation leaks when the two flat surfaces 60, 84 meet. Commonly when adjoining two pieces of machined metal parts, a small gap between the parts can form, despite the fact that high precision CNC machines are used in manufacturing the parts. In order to avoid leakage from these regions in the design, grooves are introduced in one of the machined parts and a matching protruding part in the adjoining one. The second part of the radiation trap assembly has a slightly modified design as it fits into a recess machined in the monochromator body, effectively blocking the X-rays.

Figure 5:
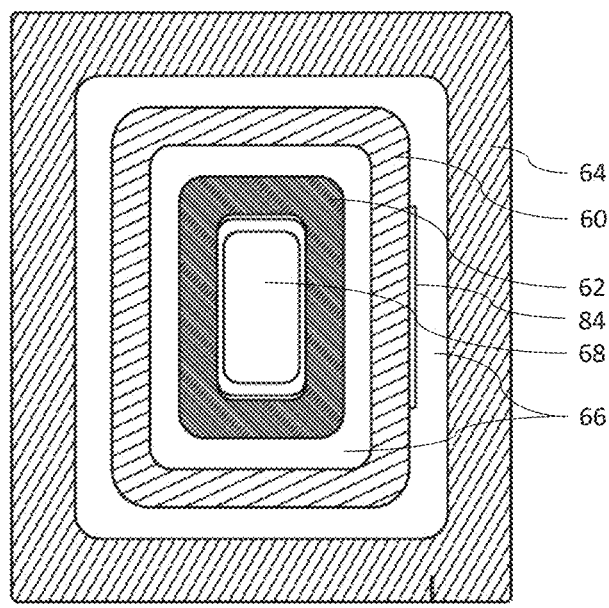
FIG. 5 is a cross-sectional view along the optical axis of the particle beam, in which the first, second and third parts of the radiation wall assembly are visible as well as the intermediate air gap.

FIG. 5 is a cross-sectional view of the radiation trap assembly as viewed from the particle beam axis. It shows the air gaps between the three parts that constitutes the radiation trap. The first part 60 is inserted into the void formed by the second 62 and third 64 parts of the trap. A Kapton window 68 seals the monochromator tank.

Figure 6:
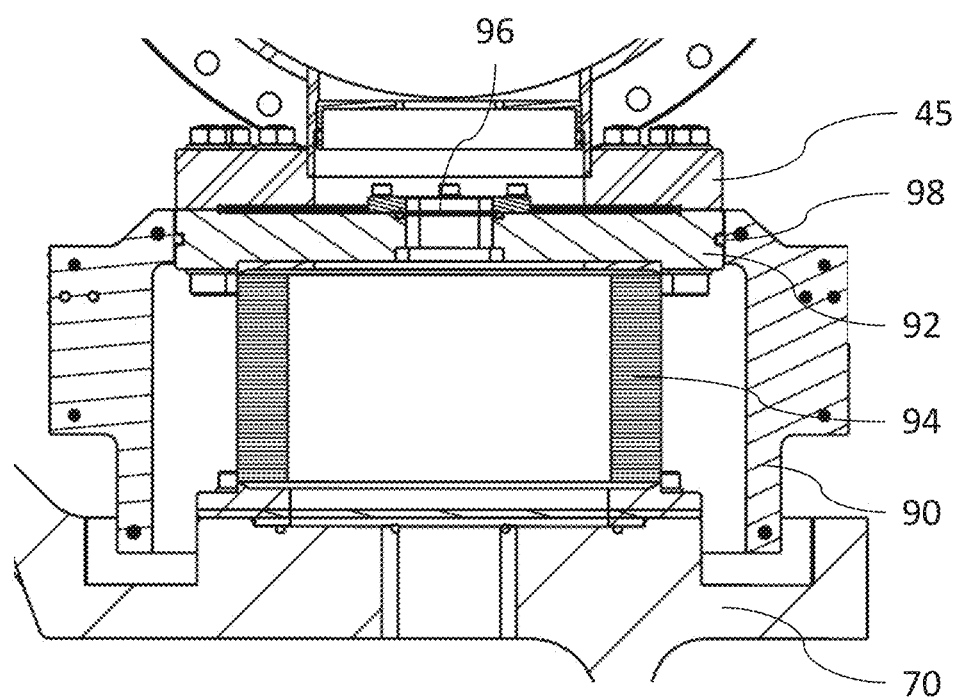
FIG. 6 is a cross-sectional view of the second embodiment of the invention, in which the radiation trap is designed to prevent leakage from an edge-welded, flexible vacuum bellow.

FIG. 6 discloses a second embodiment of a radiation trap assembly. This embodiment features a flexible bellow 94. The radiation wall part 90 of the second radiation trap is made of brass (SS5170), while the part of the radiation trap assembly it is mating to, is integrated into the monochromator tank 70. This allows for an even more compact design. Here it is the bellow 94 itself, the Kapton window 96 and the inner surface of a bellow flange 92 (AISI304) that can act as a source of radiation. The bellow is affixed to the monochromator tank by screws and interlocked via the vacuum criterion as in the design according to the first embodiment, i.e. according to the first radiation trap. The same type of grooves 98 are used to block radiation escaping from the thin gaps between flat surfaces. The reason for fitting the second radiation trap to the monochromator exit port is because the edge-welded bellow has to be sufficiently thin to allow for the necessary motion between monochromator and analysis vacuum chamber 45, but this inevitably means that radiation of the highest energy can pass through the material. The design of the trap allows for the same approximately 10 mm, or more if needed, motion in all three dimensions independently. Thus, an observer cannot be exposed to radiation of lower orders including the ternary field, as all exposed surfaces are out of line of sight.

According to an alternative embodiment of the present invention, the gap between the X-ray source and the monochromator vacuum chamber, and the first radiation trap to shield the ambient from the radiation when the gap is illuminated, are both enclosed by a housing. This housing is further configured to encapsulate ambient gas surrounding the gap. Depending on the particular application needs, the gas could be any gas, such as air, nitrogen, argon, helium or other noble gas. The state of the gas is depressurized or pressurized, also depending on application needs. Either of, or both of, the first and the second radiation traps are suitable for encapsulation according to any of the following embodiments.

In case a gas is used having a pressure lower than ambient air pressure, a pressure which is obtainable by means of a vacuum pump, a reduced number of collisions between gas particles and X-rays can be expected and thus, less absorption of X-ray radiation, especially for lower energy X-ray radiation. Also contamination on the experimental equipment, in particular Kapton windows, is reduced. The lifetime of the windows are thus expected to increase, which is beneficial at least for the reduced service and maintenance requirement on the system. This has also the additional advantage of potentially reducing the required thickness of encapsulating Kapton windows, since the difference in pressure between the vacuum chambers and the housing encapsulating the gap and radiation trap/traps requires corresponding material thicknesses to avoid imploding windows. A reduced thickness gives the advantage of less absorption and thus a potentially higher X-ray radiation flux. As an alternative given the lower pressure difference, other X-ray window materials can be considered with different strength and transmission properties. This could be beneficial for especially lower energy X-ray radiation ranges.

On the other hand, if a pressure higher than the ambient air pressure is used, a pressure which is obtainable be means of a pressurizing pump, a gas can be introduced into the housing by means of so-called purging. The previous gas is thereby replaced by the introduced gas, which could be beneficial when nitrogen as an inert gas replaces air. The higher pressure also allows a filter arrangement to be used for filtering the gas before introduction. This may thus lead to less contamination.

As yet another embodiment, the gas pressure may be the same as or similar to the ambient air, i.e. the air outside of the housing.

Alternative designs include fixing a thin flexible Pb foil to the bellow or surrounding the gap, but the use of Pb is prohibited as it is toxic and must not be touched be the naked skin. Strong regulatory demands are in effect when using this material in designs where humans can be exposed. A variant of this is to use rubber in which Pb-particles has been incorporated, but a mat with enough thickness must be applied and therefore the motion is hindered, which is also relevant in the case of a thin Pb foil. In order to allow for movement of the parts, these protective covers (Pb foil or Pb-rubber) must be removed and in this process, radiation will inevitably leak into the ambient.

However, as a last alternative embodiment of the invention, in order to comply with applicable regulatory demands, a bellow is designed using Pb rubber sheets that will be flexible enough to handle the relative movements and in the same time absorb the X-ray radiation.

The invention claimed is:

1. A hard X-ray photoelectron spectroscopy (HAXPES) system, in particular a laboratory-based system, comprising:
   an X-ray tube providing a beam of photons, which via an X-ray monochromator is directed through the system so as to excite electrons from an illuminated sample,
   the X-ray tube being functionally connected to a monochromator vacuum chamber in which a crystal is configured to monochromatize and focus the beam onto the sample,
   the monochromator vacuum chamber is connected to an analysis vacuum chamber via a flexible vacuum bellow, which is fixed to both vacuum chambers, the flexibility of the bellow allowing alignment of the monochromatized and focused beam,
   the illuminated sample being mounted on a manipulator, movable in at least one direction to allow for measurements at different sample angles, inside the analysis vacuum chamber,
   the analysis vacuum chamber being connected to an electron energy analyser, which is mounted onto the analysis vacuum chamber, wherein
   a gap is provided between the X-ray tube and the monochromator vacuum chamber, wherein the gap is provided with a first radiation trap to shield the ambient from the radiation when the gap is illuminated with X-rays from the X-ray tube, and
   wherein the flexible vacuum bellow, allowing precise alignment of the monochromated and focused beam, is provided with a second radiation trap to shield the ambient from the radiation when the flexible vacuum bellow, or the material surrounding it, is illuminated with X-rays from the X-ray tube.

2. The system according to claim 1, wherein the first and the second radiation traps are arranged so that 3-20 mm motion in all three dimension independently are allowed.

3. The system according to claim 1, wherein the first and the second radiation traps are arranged so that parts illuminated by the ternary radiation field of the X-ray tube are not in line of sight of an observer looking into the radiation trap.

4. The system according to claim 1, wherein the gap is enclosed by a housing, the housing configured to encapsulate gas surrounding the gap, the gas being either air, nitrogen, argon or helium, the gas pressure being controllable according to any of the following alternatives:
   lower than ambient air pressure, obtainable by means of a vacuum pump;
   higher than ambient air pressure, obtainable be means of a pressurizing pump through which the gas is filtered; or
   substantially equal to the ambient air pressure.

5. The system according to claim 1, wherein a load-lock chamber is provided from which entry to the sample in the analysis vacuum chamber is provided to allow manual access to the analysis vacuum chamber with only a minimum of vent.

6. The system according to claim 1, wherein the first radiation trap comprises:
   a first radiation wall part, where the first part is attachable to a part of a vacuum vessel wall of the X-ray tube,
   a second radiation wall part, wherein the second part is affixed to the monochromator vacuum chamber, and
   a third radiation wall part, wherein the third part is affixed to the monochromator vacuum chamber.

7. The system according to claim 6, wherein the third radiation wall part is connected to an interlock system, which is configured to monitor that the third radiation wall part is in correct position, and in case the third radiation wall part is moved out of position, the interlock system turns off the X-ray tube.

8. The system according to claim 7, wherein the interlock system is configured to turn the X-ray tube on and off using at least one micro-switch.

9. The system according to claim 6, wherein the second radiation wall part is arranged integrally with the monochromator vacuum chamber, which in turn is connected to the interlock system, whereby venting of the monochromator vacuum chamber actuates the interlock system, which results in turning off the X-ray tube.

10. The system according to claim 1, wherein the second radiation trap is provided with:
    an exit radiation wall part, wherein
    the exit radiation wall part is attachable to a wall of the analysis vacuum chamber, and when an entrance radiation wall part of the radiation trap onto which the exit radiation wall part is mated to, is integrated into a wall of the monochromator vacuum chamber.

11. The system according to claim 10, whereby grooves in the entrance and/or exit radiation wall parts are provided to block radiation escaping from thin gaps between flat surfaces.

12. The system according to claim 11, whereby the exit radiation wall part is configured to fit with an exit port of the monochromator vacuum chamber.

13. The system according to claim 1, wherein the crystal is a bent Si crystal with a radius to produce a Rowland circle of 300-700 mm.

14. The system according to claim 1, wherein the electron energy analyser is of the hemispherical electron energy analyser type.

15. The system according to claim 14, wherein the hemispherical analyser is mounted onto the analysis vacuum chamber, in such a way that an entrance slit of the hemispherical analyser is essentially horizontally aligned with respect to the X-ray footprint on the sample.

16. The system according to claim 1, wherein the photon energy of the X-ray tube is 9.25 keV and originating from the characteristic $K\alpha$ radiation from a Ga alloy.

17. The system according to claim 1, wherein the flexible bellow is designed using Pb rubber sheets of a flexibility sufficient to allow for the relative movements between the X-ray monochromator and the analysis vacuum chamber.

18. The system according to claim 1, wherein the X-ray tube comprises an electron gun that excites liquid Ga to an energy level of above 60 keV.

19. The system according to claim 1, wherein X-ray tube comprises an electron gun that excites liquid Ga to an energy level of at least 70 keV.

20. The system according to claim 1, wherein the crystal is a bent Si crystal with a radius to produce a Rowland circle of 550 mm.

* * * * *